United States Patent [19]

Frye et al.

[11] Patent Number: 6,097,273
[45] Date of Patent: Aug. 1, 2000

[54] THIN-FILM MONOLITHIC COUPLED SPIRAL BALUN TRANSFORMER

[75] Inventors: Robert Charles Frye, Piscataway; Yeong-Joo Loon, Highland Park, both of N.J.

[73] Assignee: Lucent Technologies Inc., Murray Hill, N.J.

[21] Appl. No.: 09/366,841

[22] Filed: Aug. 4, 1999

[51] Int. Cl.[7] .................................................. H01F 5/00

[52] U.S. Cl. ........................ 336/200; 336/232; 336/223

[58] Field of Search .................................. 336/200, 223, 336/232, 83

[56] References Cited

U.S. PATENT DOCUMENTS 5,477,204  12/1995  Li .............................................. 336/200
5,583,474  12/1996  Mizoguchi et al. ...................... 336/83

*Primary Examiner*—Michael L. Gellner
*Assistant Examiner*—Anh Mai

[57] ABSTRACT

A balanced/unbalanced (balun) transformer has at least one pair of stacked coupled spiral lines. The spiral lines are formed on different levels of the device with the upper spiral line nested between the lower spiral line. This structure allows the width W and spacing S of the lines to be independently varied. Analysis of devices made with this configuration shows an optimum ratio of W to W+S of from 0.4 to 0.6.

7 Claims, 2 Drawing Sheets

THIN-FILM MONOLITHIC COUPLED SPIRAL BALUN TRANSFORMER

FIELD OF THE INVENTION

This invention relates to thin film balun transformers using thin film spiral configurations.

BACKGROUND OF THE INVENTION

Balanced/unbalanced transformers (baluns) are a key component of double-balanced mixer and push-pull amplifier designs in wireless systems. They provide balanced outputs from an unbalanced input. Balanced output for wireless applications requires half the input signal amplitude at each of two output terminals, 180° out of phase with each other. In principle, conventional transformer designs can produce this result. However, conventional transformer designs, typically wire wound devices, have an upper frequency limit of several hundred megahertz due to magnetic flux leakage and capacitive coupling between the windings. Current wireless applications require very high frequency operation at low power. Active balun designs provide high frequency but operate with high DC power consumption. Passive baluns are therefore preferred. Of the known passive balun designs, Marchand type devices have become the device of choice for wireless applications. They provide excellent balance and can be made in small, easily integrated, geometries. The preferred Marchand balun, from the standpoint of miniaturization, is the spiral coil type. A version of the spiral Marchand balun has been reported by T. Gokdemir et al., IEEE MTT-S Int'l Microwave Symp. Dig., pp. 401–404. They implemented the spiral balun using GaAs MMIC technology and two side-by-side spiral microstrip lines.

Chen et al. have also reported monolithic passive balun designs using meandered line configurations. See Chen et al., "Broadband Monolithic Passive Baluns and Monolithic Double-Balanced Mixer", IEEE Trans. Microwave Theory Tech., Vol. 39, No. 12, pp. 1980–1991. They use "rectangular spiral" configurations with air bridges to access the strip lines. A GaAs technology is used but the device geometry, in particular the strip line geometry, is not optimized for efficient integration.

A more compact balun design has been reported by M. Engles et al. See "A novel compact balun structure for multi-layer MMICs," Proc. 26$^{th}$ European Microwave Conf., pp. 692–696, September 1996. This design uses a stacked spiral configuration with one coil overlying another.

There continues to be a need for high frequency, low power, baluns that are inexpensive, and can be easily and efficiently integrated.

SUMMARY OF THE INVENTION

We have designed a monolithic balun device which can be easily integrated with Si IC package technology and gives exceptional impedance matching for a compact structure. An important feature of the design is a multi-level stacked spiral structure with coils nested, i.e. offset, in the vertical plane. The device is implemented in a multilevel interconnect technology which gives high performance and low cost. The use of separate spiral lines on different levels allows the line thickness and spacing, and the overlap characteristics of the lines, to be independently varied. As a result, an optimum range of ratios of thickness to spacing has been discovered.

DETAILED DESCRIPTION

Stacked balun devices in principle should be compact and efficient. However, the characteristic impedance, $Z_O$, of the stacked structure is determined mainly by the ratio of the dielectric thickness to line width. This makes it difficult to match the impedance of the balun with the characteristic impedance of an external line, e.g. 50 ohms. Matching in this case requires either a relatively thick dielectric, poorly suited to a thin film technology, or a very narrow width of conductor with large resistive loss.

Figure 1:
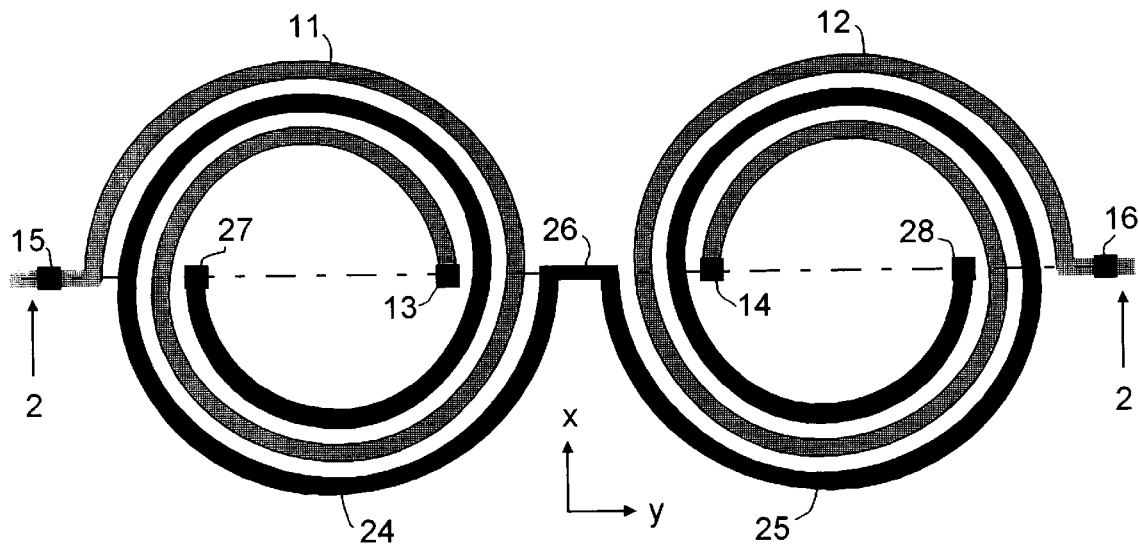
FIG. 1 is a schematic diagram of the nested spiral strip lines of the balun device of the invention.

A monolithic balun device structure that is better suited to multilayer thin film technologies is shown schematically in FIG. 1. Coil 11 is a flat spiral, spiraling outward in a counterclockwise orientation. Coil 24 is essentially identical to spiral coil 11 except that it is rotated with respect to coil 11. For the purpose of defining the invention, coil 11 is assigned an initial radius r, and originates from point at reference numeral 13 which can be designated "$d_1$" from which the radius of the coil increases in the x-y plane. If coil 24 has an identical spiral, and begins at a point at reference numeral 27, which can be designated "$d_2$", and point $d_2$ is 180° from point $d_1$ in the x-y plane using a circle with radius r as the reference, then the arrangement of FIG. 1 results, i.e. the coils are nested as shown. Additionally, coil 24 is offset in the z-direction, so that coils 11 and 24 are not in the same x-y plane. This structure allows the center-to-center spacing of the lines (which primarily determines mutual inductance), and the degree to which they overlap (which primarily determines mutual capacitance) to be independently varied. Using thin film techniques, the structure is made nearly coplanar, so that characteristic impedance is mainly determined by the lateral dimensions of the conductors and is essentially independent of dielectric thickness. Referring again to FIG. 1, a second pair of stacked coils 12 and 25 are formed as either a mirror image of the first pair, or counterclockwise rotation of the first pair by 180° with respect to the x-axis. Coils 24 and 25 are connected together by runner 26. Coils 11 and 12 are connected together by a crossover connecting via 13 with via 14. FIG. 1 shows two pairs of stacked spiral coils. The device of the invention may have a single pair of coils, or any number of paired coils.

For a fixed inner radius, number of turns and center-to-center distance between the adjacent lines (pitch), the variation of line width results in a different amount of overlap between the two spirals while maintaining a fixed overall conductor length. This changes the mutual capacitance between the coils, while only slightly changing the self-inductance. Mutual inductance is primarily determined by center-to-center distance and it is relatively insensitive to this variation of the overlap. Increasing the coil length, either by adding turns or enlarging the inner radius, is equivalent to increasing the electrical length, which determines the center frequency of the balun. By analogy with coupled transmission line theory, the band center occurs at the quarter-wavelength resonant frequency of the individual segments.

Figure 2:
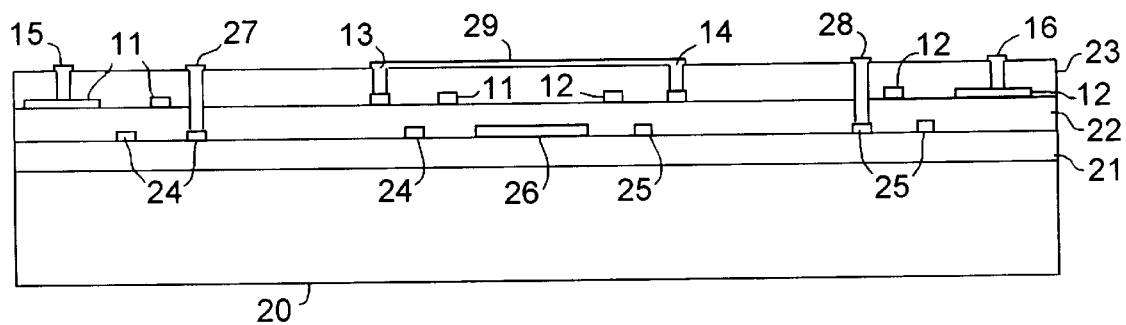
FIG. 2 is a cross section of the balun device of the invention showing the preferred fabrication technology.

The thin film technology used to fabricate a balun structure like that of FIG. 1 is illustrated in FIG. 2. The substrate is a suitable thin film base material such as glass, ceramic, or a semiconductor such as silicon or GaAs. In the embodiment shown, substrate 20 is silicon with SiO$_2$ layer 21. The lower of the pairs of spiral coils, 24 and 25, are formed on layer 21 by depositing a conductor layer, e.g. Al, and patterning the layer by standard lithography. Typical thickness for the aluminum conductor layer is in the range 1–5 μm. Individual spiral coils at this level can be interconnected directly via buried runner 26. The first interlevel dielectric layer is shown at 22, and may be SiO$_2$ or other suitable material. Preferably layer 22 is a polymer such as polyimide. The second metal layer, which may be of the same material and thickness as the first, is deposited over the first interlevel dielectric 22, and patterned to form the upper pair of spiral coils 11 and 12. The second interlevel dielectric 23, preferably polyimide, is formed over coils 11 and 12. Vias are made to the first and second metal levels to interconnect the coils. Vias 27 and 28 connect to the terminals of coils 24 and 25. Coils 11 and 12 are connected together with vias 13 and 14, and runner 29. Vias 15 and 16 connect to the terminals of coils 11 and 12. The ground plane for the device (not shown) may be a frame or ring around the device.

Figure 3:
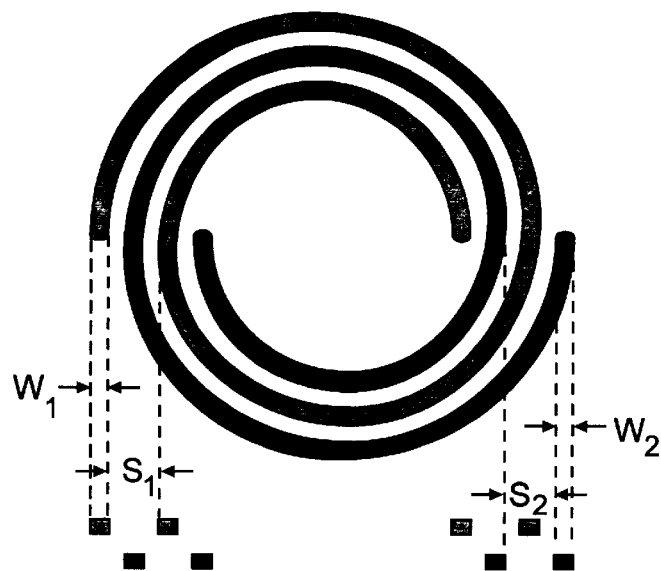
FIG. 3 is a diagram showing dimensions relevant to the optimum performance range for the device of FIG. 1.

Referring to FIG. 3, the relevant dimensions used to optimize the stacked balun performance are shown. The width of the upper coil 11/12 is designated $W_1$, and the spacing between turns of this coil is designated $S_1$. The width of the lower coil 24/25 is designated $W_2$, and the spacing between turns of this coil is designated $S_2$. The preferred case is where $W_1$ and $W_2$ are the same, i.e. $W=W_1=W_2$, and $S_1$ and $S_2$ are the same, i.e. $S=S_1=S_2$. However, different values for these parameters can be used if desired.

According to the invention, the fabrication of the coils on different levels allows W to be independent of S. By contrast, if all coils are on the same level, the device design is restricted by values of W that are less than S. Using the multi-level approach of the invention, W can be made wider than S so that the baluns, in the vertical plane, overlap. Dimensions W and S are limited only by pattern resolution. Another feature of the structures shown is that current flow in side by side lines is always in the same direction, enhancing mutual inductive coupling.

To demonstrate the effectiveness of the invention a series of balun devices were fabricated and electrically characterized. Several different substrate materials were used, including high resistivity silicon (>4000 ohm cm), low resistivity silicon (~20 ohm cm), and glass. The silicon substrates had 1 μm thick grown oxide layers for added electrical isolation. The metal patterns were aluminum, 3 μm thick. The interlevel dielectric was polyimide, 4 μm thick. The aluminum was deposited by sputtering, then masked, and etched using wet chemical etching. The interconnection layer was Cr/CrCu/Cu/Au. Design parameters for the examples are given in the following Table.

TABLE I

| Design | $r_i$ (μm) | W (μm) | S (μm) | # Turns |
|--------|-----------|--------|--------|---------|
| A | 200 | 30 | 40 | 3.5/4.5/5.5/6.5 |
| B | 225 | 30 | 40 | 3.5/4.5/5.5/6.5 |
| C | 250 | 30 | 40 | 3.5/4.5/5.5/6.5 |
| D | 300 | 30 | 40 | 3.5/4.5/5.5/6.5 |
| E | 200 | 50 | 70 | 3.5/4.5/5.5/6.5 |
| F | 250 | 50 | 70 | 3.5/4.5/5.5 |
| G | 300 | 50 | 70 | 3.5/4.5/5.5 |
| H | 300 | 100 | 160 | 3.5/4.5/5.5 | where $r_i$ is the initial radius of the coil measured from the center of the coil to the middle of the metal width at position 13.

Return loss was measured for these device designs. Measured return loss at the center frequency was found to be between 13 and 18 dB. Lumped model simulations also predict values near 13 dB. The return loss is mainly determined by the effective characteristic impedance of the coupled-line structure. Since mutual capacitance is the dominant value in the total capacitance, the characteristic impedance of the spiral baluns do not vary significantly when the geometry of the conductors is fixed. Thus, return loss is relatively independent of substrate materials.

The insertion loss for these device designs was also measured. Increased line length results in more loss, suggesting that metal resistance plays an important role. The conductor material in these investigations was aluminum, following standard thin film and IC technology. However, other conductive materials, notably Au, Pt, Pd, and copper, may be used to obtain better resistivity characteristics. Insertion loss for baluns on glass with conductors 100 μm wide and 6 μm thick (design H in Table I) were found to be 0.55 dB. The length for these devices was 1.663 cm and the center frequency was 1.45 GHz.

For optimum operation, the input and output impedances of these devices should be well matched to common transmission line impedances. These generally fall in the range from 25 to 100 ohms, with 50 ohm impedance being the most commonly used. Through measurements and analysis it was found that the impedance characteristics can be conveniently adjusted by varying the ratio of W to (W+S). Fixing the sum of (W+S), along with the inner radius and number of turns in the spiral, makes the total length of the line in the spiral constant, and then varying W changes the inductive and capacitive properties of the coupled line. Devices using the principles of the invention will typically have spirals with at least 1.5 turns to produce the advantageous results described here.

Figure 4:
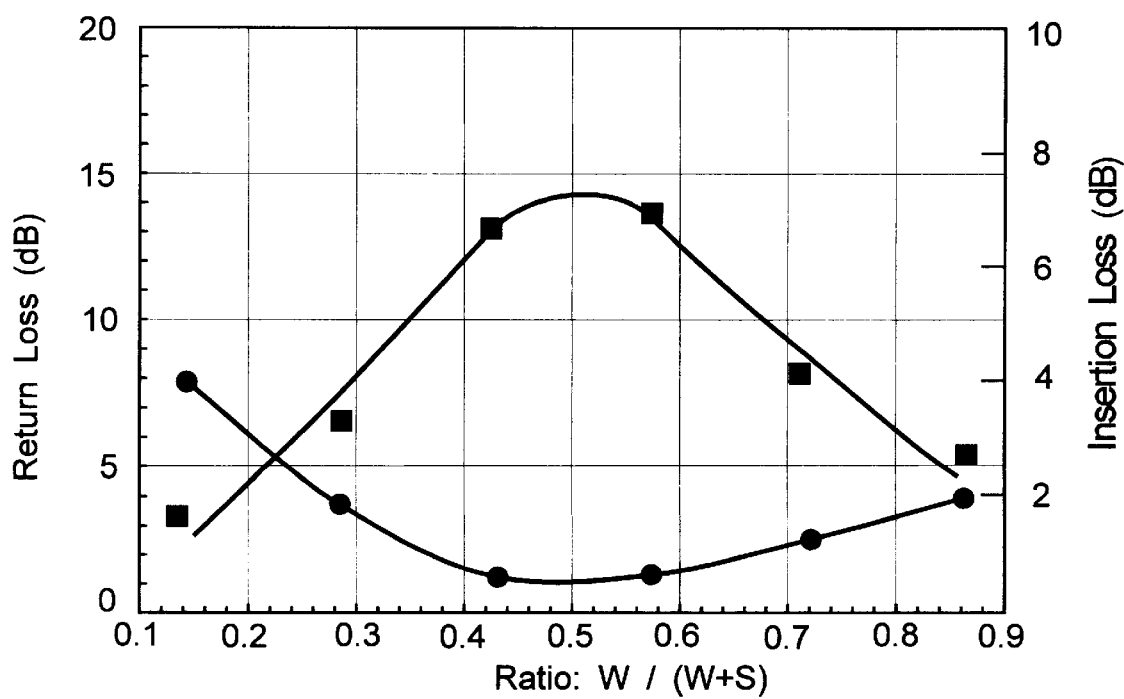
FIG. 4 is a plot of loss vs. the ratio of width to (width+ spacing) for the device of FIG. 1.

Loss measurements are plotted vs. W/W+S in FIG. 4. For these measurements the balun was coupled to a 50 ohm transmission line. It is generally desirable in these devices to have low insertion loss and high return loss. From FIG. 4, it is seen that an optimum range for W/(W+S) exists between 0.4 and 0.6. Further investigations show that this optimum range applies across a wide class of device designs and operating frequencies.

The most common mask and etch operations in advanced thin film technology employ photolithography for making the mask, and photolithographic steppers as the exposure tool, usually at a wavelength in the deep UV. However, e-beam or x-ray lithographic techniques can also be used. Accordingly, reference may be made herein to lithography and lithographic steps, and that reference is intended to include these alternative techniques.

The balun devices described here have coupled coils which are essentially identical in geometry. As mentioned earlier both coils have the same width and spacing. Designs may be developed where these parameters are different from coil to coil, or the number of turns, or the curvature of the spiral are varied. Such departures make performance analysis complex due to variations in coupling along the length of the coupled lines. However, applications may be found for such devices, and designs based on differences in coil parameters, as long as they employ the essential characteristics of this invention as described and claimed are to be considered within the scope of the invention.

Likewise, device designs can be envisioned that use three or more stacked coils, with each succeeding coil in the stack nested with the coils below. Whereas the device described and analyzed above employs two stacked coils, that is not to be construed as a limitation on the spirit and scope of the invention.

Various other modifications of this invention will occur to those skilled in the art. All deviations from the specific teachings of this specification that basically rely on the principles and their equivalents through which the art has been advanced are properly considered within the scope of the invention as described and claimed.

We claim:

1. A balun device comprising:

a. an electrically insulating substrate with a surface in the x-y plane, b. a first coil formed on said substrate, said first coil comprising a spiral conductor with said spiral conductor beginning at point $d_1$ in the x-y plane and having a radius increasing from initial radius r, said spiral conductor having at least 1.5 turns with a spacing S between turns, and said spiral conductor having a width W, c. an interlevel dielectric covering said first coil, d. a second coil formed on said substrate, said second coil comprising a spiral conductor/with said spiral conductor having a radius increasing from initial radius r, said spiral conductor having at least 1.5 turns with a spacing S between turns, and said spiral conductor having a width W, and having essentially the same geometry as said first spiral conductor and beginning at a point $d_2$ in the x-y plane, where point $d_2$ lies 180° from point $d_1$ on a circle with initial radius r, e. a third coil formed on said interlevel dielectric, connected to said first coil and overlying said first coil with a geometry in a mirror image of said first coil as reflected in said x-y plane, and f. a fourth coil formed on said interlevel dielectric, connected to said second coil and overlying said second coil with a geometry in a mirror image of said second coil as reflected in said x-y plane.

2. The device of claim 1 wherein W/W+S is in the range 0.4–0.6.

3. The device of claim 2 wherein said substrate is high resistivity silicon.

4. The device of claim 3 wherein said substrate is covered with $SiO_2$.

5. The device of claim 2 wherein said substrate is glass.

6. The device of claim 2 wherein each of said spiral conductors are of a material selected from the group consisting of Al, Au, Cu, Pt, and Pd.

7. The device of claim 2 wherein the spiral conductors of the first and second coils have at least 1.5 turns.

* * * * *